(12) United States Patent
Namiki

(10) Patent No.: US 6,219,629 B1
(45) Date of Patent: Apr. 17, 2001

(54) APPARATUS FOR COMBINED SIMULATION OF ELECTROMAGNETIC WAVE ANALYSIS AND CIRCUIT ANALYSIS, AND COMPUTER-READABLE MEDIUM CONTAINING SIMULATION PROGRAM THEREFOR

(75) Inventor: Takefumi Namiki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/076,069

(22) Filed: May 12, 1998

(30) Foreign Application Priority Data

Nov. 19, 1997 (JP) .................................................. 9-317891

(51) Int. Cl.[7] .............................. G06F 17/50; G06F 17/10

(52) U.S. Cl. .................................................. 703/13; 703/4

(58) Field of Search ........................ 395/500.25, 500.26, 395/500.43; 703/2, 13, 14

(56) References Cited

U.S. PATENT DOCUMENTS 5,995,733 * 11/1999 Roychowdhury ............... 395/500.07
6,083,266 * 7/2000 Ohtsu et al. ............................. 703/2

OTHER PUBLICATIONS

Y. Kanda, et al., 'A Few Consideratins on Direct Linking of FDTD and SPICE', the Institute of Electronics, |‡□ormation and Communication Engineers, TR of IEICE, JUL. 7, 1997, pp. –1–15.*

* cited by examiner

Primary Examiner—Kevin J. Teska
Assistant Examiner—Lonnie A. Knox
(74) Attorney, Agent, or Firm—Staas & Halsey LLP

(57) ABSTRACT

A simulator apparatus for a combined simulation of electromagnetic wave analysis and circuit analysis, which is configured to produce stable solutions with a smaller amount of processing loads. An electromagnetic wave analyzer calculates magnetic field at a simulation time $t_{em}01$ and then electric field at another simulation time $t_{em}02$ thereby performing a transient analysis of electromagnetic waves. A circuit analyzer solves the given circuit equation at still another simulation time $t_{cs}$ that is incremented by a variable time step size $\Delta t_{cs}$ determined in accordance with the circumstances. A current source data transfer unit compares $t_{em}01$ and $t_{cs}$, and if their difference falls below a time difference threshold $\lambda 1$, it calculates current source data for the equivalent circuit, based on the magnetic field obtained by the electromagnetic wave analyzer. The current source data transfer unit then transfers the resultant current source data to the circuit analyzer. An electric field data transfer unit, on the other hand, compares $t_{em}02$ and $t_{cs}$, and if their difference falls below a time difference threshold $\lambda 2$, it calculates electric field data for the circuit's local space, based on the voltage obtained by the circuit analyzer. The resultant electric field data is then transferred to the electromagnetic wave analyzer.

6 Claims, 9 Drawing Sheets

APPARATUS FOR COMBINED SIMULATION OF ELECTROMAGNETIC WAVE ANALYSIS AND CIRCUIT ANALYSIS, AND COMPUTER-READABLE MEDIUM CONTAINING SIMULATION PROGRAM THEREFOR

BACKGROUND OF THE INVENTION

1. Field of the Invention

The present invention relates to simulator apparatus for a combined simulation of electromagnetic wave analysis and circuit analysis, as well as to computer-readable media containing a simulation program designed therefor. More particularly, the present invention relates to a simulator apparatus for a combined simulation of electromagnetic wave analysis and circuit analysis, in which the time step size of the circuit analysis may vary in accordance with the circumstances, and a computer-readable medium containing a simulation program that performs such a simulation.

2. Description of the Related Art

In today's computational electromagnetics, the Finite-Difference Time-Domain (FD-TD) method is used as a practical technique to analyze the transitional behavior of electromagnetic waves by using a computer for numerical simulation. The FD-TD, which solves Maxwell's equations in the time and spatial domains with difference methods, is actually implemented to a variety of cases because of its wide scope of applications.

In the field of circuit analysis, on the other hand, there are different computer simulation tools which numerically analyze the transient behavior of an electronic circuit. Generally, they calculate the circuit's node voltages and branch currents on the basis of Kirchhoff's laws. The circuit analysis tools are further equipped with programs for modeling the characteristic equations of semiconductor devices and other circuit elements having nonlinear voltage-current characteristics, and to solve those nonlinear equations, they employ some numerical techniques such as Newton-Raphson methods.

Researchers have also proposed another numerical simulation method that performs both an electromagnetic wave analysis and a circuit analysis in a combined manner. In this proposed method, the simulation steps proceed along the time axis, keeping a close linkage between the electromagnetic field physics obtained by the electromagnetic wave analysis and the voltage-current physics obtained by the circuit analysis. With capabilities of both an electromagnetic wave analysis and a circuit analysis, this hybrid numerical simulation technique provides an advantage in that it solves the characteristics of circuit elements and the electromagnetic field behavior in their surrounding space in a unified manner. It is particularly useful for the analysis of high-frequency signals propagating in a circuit.

When using FD-TD techniques to numerically simulate the transient behavior of an electromagnetic wave, it is desirable that the time step size ($\Delta t_{em}$) be as large as possible within a range determined by the following condition for stability.

$$\Delta t_{em} \leq \frac{1}{v\sqrt{\left(\frac{1}{\Delta x_{min}}\right)^2 + \left(\frac{1}{\Delta y_{min}}\right)^2 + \left(\frac{1}{\Delta z_{min}}\right)^2}} \quad (1)$$

Here, $v$ is the speed of electromagnetic waves; $\Delta x_{min}$, $\Delta y_{min}$, and $\Delta z_{min}$ represent the minimum values of spatial discretization intervals defined in the x-, y-, and z-directions, respectively. The above constraint about the time step size derives from the following reasons: (a) the numerical solution would diverge if $\Delta t_{em}$ was larger than the right side of the condition (1), and (b) the overall computation time of numerical simulation would increase if an unnecessarily small value was set to $\Delta t_{em}$. Usually, the time step size $\Delta t_{em}$ is determined within the following range.

$$0.90 \times \frac{1}{v\sqrt{\left(\frac{1}{\Delta x_{min}}\right)^2 + \left(\frac{1}{\Delta y_{min}}\right)^2 + \left(\frac{1}{\Delta z_{min}}\right)^2}} \leq \quad (2)$$

$$\Delta t_{em} \leq 0.99 \times \frac{1}{v\sqrt{\left(\frac{1}{\Delta x_{min}}\right)^2 + \left(\frac{1}{\Delta y_{min}}\right)^2 + \left(\frac{1}{\Delta z_{min}}\right)^2}}$$

Once it is determined, the value of $\Delta t_{em}$ is used without changes, throughout the simulation period.

As opposed to this, the time step size ($\Delta t_{cs}$) in the transient circuit simulation normally varies in accordance with the circumstances. For example, when numerically solving nonlinear circuit equations, the time step size should be reduced if the solution for potential differences does not converge. To allow the electromagnetic wave analysis and circuit analysis to exchange data with each other, it is therefore necessary to synchronize their simulation clocks in a reliable and efficient manner, so that they will transfer data to each other at the definite time points.

Now, the next paragraphs will discuss the timing of data transfer operations between the electromagnetic wave analysis and the circuit analysis.

FIG. 9 is a diagram which shows the timing of data transfer in a conventional simulator. The upper half of FIG. 9 shows a process of electromagnetic wave analysis, while the lower half shows a process of circuit analysis. In the equations appearing in the following section, the superscripts (e.g., n, n+½, ...) affixed to the variables indicate a specific time step k, or the k-th time step within a simulation process, meaning that a time of ($k \times \Delta t_{em}$) has elapsed since the beginning of the process.

(S31) The simulator calculates magnetic field values at $t_{em}=(n+\frac{1}{2})\Delta t_{em}$, where n is a natural number, and $t_{em}$ is a simulation time in the electromagnetic wave analysis. Here, the magnetic field H is calculated by $$H^{n+\frac{1}{2}} = H^{n-\frac{1}{2}} - (\Delta t_{em}/\mu) \text{ rot } E^n \quad (3)$$

where $\mu$ is permeability, and "rot" represents the rotation (or curl) of a vector function.

(S32) The simulator then calculates current source data I on the basis of the magnetic field H obtained in step S31 as part of the electromagnetic wave analysis, and transfers the resultant value to the circuit analysis. This current source data I is obtained by the following.

$$I^{n+\frac{1}{2}} = \Sigma H^{n+\frac{1}{2}} \quad (4)$$

(S33) Based on the current source data I supplied from the electromagnetic wave analysis, the simulator executes a circuit analysis at $t_{cs}=(n+\frac{1}{2})\Delta t_{em}$, where $t_{cs}$ is a simulation time in the circuit analysis. Here, the behavior of the circuit is given by the following equation.

$$V^{n+\frac{1}{2}} = Z^{-1} I^{n+\frac{1}{2}} \quad (5)$$

(S34) Based on the voltage V obtained through the circuit analysis, the simulator calculates the electric field E in a specific part (i.e., cell) of the computational domain in which the circuit is located. The electric field E, given by the following, is then passed to the electromagnetic wave analysis.

$$E^{n+1} = V^{n+\frac{1}{2}}/d, \quad (6)$$

where d is the dimension of a cell in which the circuit under analysis is located.

(S35) The simulator calculates the electric field at $t_{em} = (n+1)\Delta t_{em}$, according to the following equation.

$$E^{n+1} = E^n + (\Delta t_{em}/\epsilon) \text{ rot } H^{n+\frac{1}{2}}, \quad (7)$$

where $\epsilon$ is a dielectric constant. The electric field data supplied in step S34 is then adapted to the electric field calculated in step S35, thereby yielding the entire electric field at $t_{em} = (n+1)\Delta t_{em}$.

The combined simulation for electromagnetic wave analysis and circuit analysis is accomplished in this way, by allowing the two processes to exchange the current source data and electric field data. The conventional simulation process, however, is likely to produce an unstable solution even if the time step size $\Delta t_{em}$ satisfies the stability condition (2). This problem seems to be caused by a time lag of $\Delta t_{em}/2$ between the magnetic field calculation (S31) and the electric field calculation (S35) as part the electromagnetic wave analysis. The conventional simulation process, however, does not take that time lag into consideration, unfortunately. That is, the simulator calculates the electric field at a specific time point $(n+1)\Delta t_{em}$ on the basis of the voltage at a past time point $(n+\frac{1}{2})\Delta t_{em}$, which makes the solution unstable. It may be possible to avoid such instability of solutions by reducing $\Delta t_{em}$ to about half the standard step size that is suggested by the stability condition (2). This choice, however, leads to two times longer computation time. Further, the value of $t_{cs}$ is varied in accordance with the progress of the circuit analysis, and therefore, ten is not always equal to $t_{cs}$. In a conventional simulation process, the analysis often fails due to the inconsistency in $t_{cs}$ and $t_{em}$.

SUMMARY OF THE INVENTION

Taking the above into consideration, an object of the present invention is to provide a simulator apparatus for a combined simulation of electromagnetic wave analysis and circuit analysis, which is configured to produce stable solutions with a smaller amount of processing loads.

Another object of the present invention is to provide a computer-readable medium containing a simulation program for a combined simulation of electromagnetic wave analysis and circuit analysis, which produces stable solutions with a smaller amount of processing loads.

To accomplish the above objects, according to the present invention, there is provided a simulator apparatus for performing a combined simulation in which a transient electromagnetic wave analysis for a prescribed space is linked in the time domain with a circuit analysis that analyzes a circuit placed in the prescribed space. This simulation apparatus comprises: an electromagnetic wave analyzer, a circuit analyzer, a current source data transfer unit, and an electric field data transfer unit. The electromagnetic wave analyzer performs an electromagnetic wave analysis by alternately executing a magnetic field calculation and an electric field calculation. The magnetic field calculation is based on a first simulation time that is advanced by a first time step size each time the magnetic field calculation is executed. The electric field calculation is based on a second simulation time that has a predetermined time offset with respect to the first simulation time and is advanced by the first time step size each time the electric field calculation is executed. In the electric field calculation, the electromagnetic wave analyzer waits for electric field data for a local space where the circuit is located, and upon receipt of the electric field data, it computes an entire electric field in the prescribed space by adapting the received electric field data. The circuit analyzer operates at a third simulation time that is advanced by a second time step size determined in accordance with circumstances. The circuit analyzer calculates a voltage developed across the circuit by solving a given circuit equation at the third simulation time. In this calculation of the voltage, the circuit analyzer waits for current source data for the circuit when a time difference between the first simulation time and the third simulation time falls below a first predetermined time difference threshold, and upon receipt of the current source data, it resumes the circuit analysis with the received current source data. The current source data transferring unit is activated when a time difference between the first simulation time and the third simulation time falls below the first predetermined time difference threshold. It calculates the current source data for the circuit on the basis of magnetic field obtained by the electromagnetic wave analyzer and transferring the calculated current source data to the circuit analyzer. The electric field data transfer unit is activated when the time difference between the second simulation time and the third simulation time falls below the second predetermined time difference threshold. It calculates the electric field data in the circuit's local space on the basis of the voltage obtained by the circuit analyzer, and transfers the calculated electric field data to the electromagnetic wave analyzer.

To accomplish the above objects, according to the present invention, there is provided another simulator apparatus for performing a first simulation process in combination with a second simulation process, allowing the first and second simulation processes to transfer simulation results to each other. Here, the first simulation process is based on a first simulation time that is advanced by a fixed time step size, while the second simulation process is based on a second simulation time that is advanced by a variable time step size. The simulation apparatus comprises: a first data transfer unit, an analyzer unit, and a second data transfer unit. Being activated when a time difference between the first simulation time and the second simulation time falls below a predetermined time difference threshold, the first data transfer unit transfers a simulation result of the first simulation process to the second simulation process. The analyzer unit executes the second simulation process on the basis of the transferred simulation result of the first simulation process, changing the variable time step size as required. The second data transfer unit, being activated when a time difference between the second simulation time and the first simulation time having been advanced by the fixed time step size falls below another predetermined time difference threshold, transfers a simulation result of the second simulation process to the first simulation process.

The above and other objects, features and advantages of the present invention will become apparent from the following description when taken in conjunction with the accompanying drawings which illustrate a preferred embodiment of the present invention by way of example.

DESCRIPTION OF THE PREFERRED EMBODIMENTS

An embodiment of the present invention will be described below with reference to the accompanying drawings.

Figure 1:
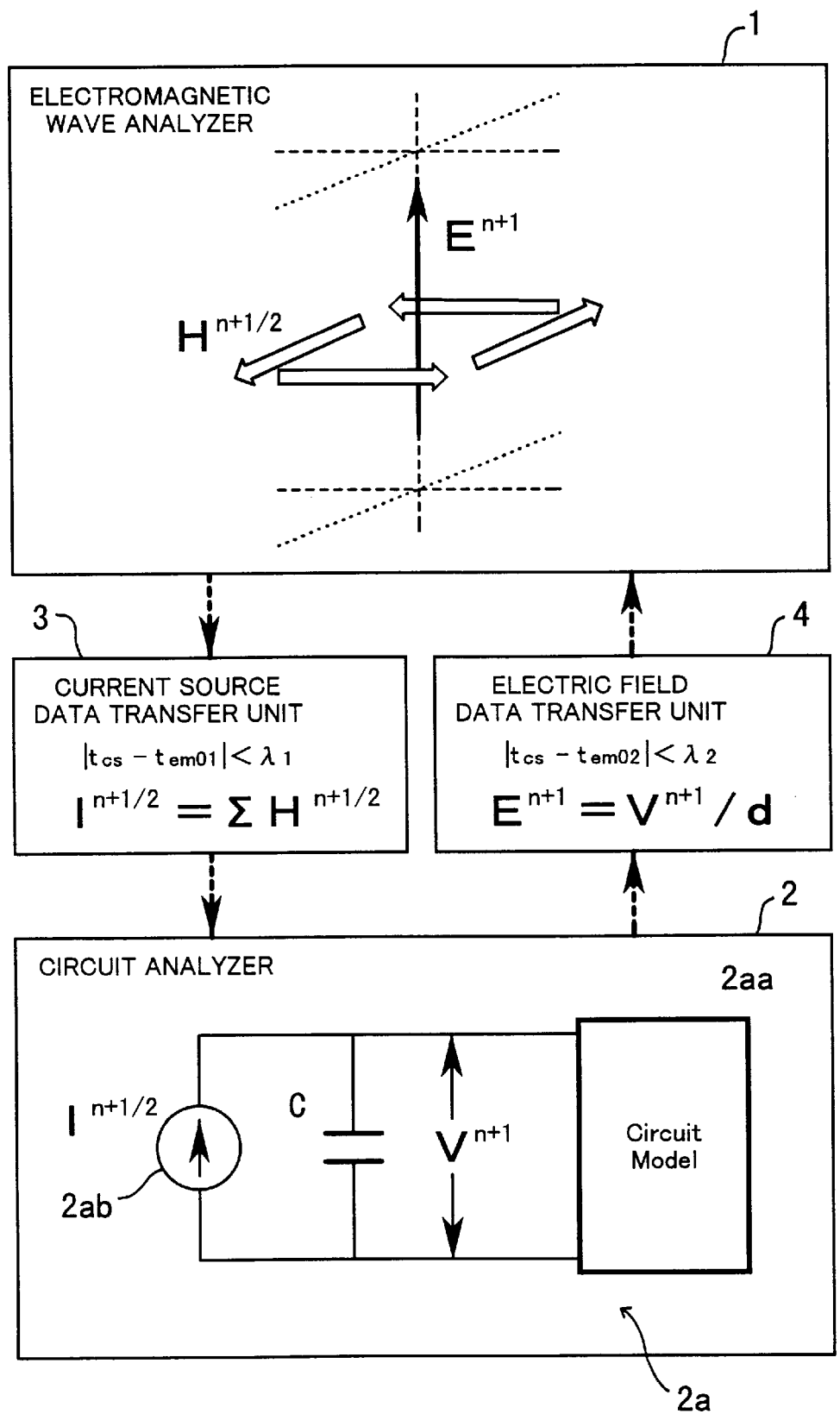
FIG. 1 is a conceptual view of the present invention.

FIG. 1 shows the concept of the present invention. The present invention proposes a simulator which performs an electromagnetic wave analysis in a predetermined space, in conjunction with a circuit analysis for a specific circuit located in the space. The proposed simulator comprises an electromagnetic wave analyzer 1, a circuit analyzer 2, a current source data transfer unit 3, and an electric field data transfer unit 4. Note that the term "circuit" denotes various electronics, ranging from a simple discrete device to an interconnected group of electrical and electronic components. It should also be noted that, in the following section, the term "simulation time" is used as a variable to indicate a virtual time point in a simulation process, but it has nothing to do with the time of day in real life.

The electromagnetic wave analyzer 1 divides a given three-dimensional space into a number of cells, and analyzes the transient behavior of electromagnetic waves by using FD-TD techniques. More specifically, the electromagnetic wave analyzer 1 calculates the electric field E on the edges of each cell and its surrounding magnetic field H to investigate their transient behavior. To represent specific time points in this process, the electromagnetic wave analyzer 1 has two time variables $t_{em}01$ (first simulation time) and $t_{em}02$ (second simulation time). During a simulation process, the first simulation time $t_{em}01$ advances by a fixed time step size $\Delta t_{em}$ (first time step size). The second simulation time $\Delta t_{em}/2$ has a fixed time offset, or lag, with respect to the first simulation time $t_{em}01$.

The electromagnetic wave analyzer 1 is configured to alternately calculate the magnetic field at $t_{em}01$ and the electric field at $t_{em}02$, thereby performing a transient analysis of electromagnetic waves. Concerning the electric field calculation, the electromagnetic wave analyzer 1 has to wait for electric field data for the circuit's "local space" to be supplied from the circuit analyzer 2, where the term "local space" refers to a specific cell or cells in which the circuit of interest is placed. When this local electric field data is ready, the electromagnetic wave analyzer 1 calculates the electric field in the entire space so that it will reflect the supplied electric field data. In the present embodiment, the supplied local electric field data is introduced in the following way. First, the electromagnetic wave analyzer 1 obtains the electric field for the space other than the circuit's local space by solving Maxwell's equations in the time and spatial domains. Then it adapts the supplied local electric field data to the electric field obtained above.

The circuit analyzer 2 performs a circuit analysis on the basis of an equivalent circuit 2a that represents the circuit of interest in a current source approach. SPICE (Simulation Program with Integrated Circuit Emphasis), for example, is an appropriate tool for the circuit analysis. This analysis takes a current source approach, where a voltage V to be developed across the circuit of interest is calculated from a given current source. The equivalent circuit 2a contains a current source 2ab connected to the terminals of the circuit model 2aa and a capacitor C connected in parallel with the current source 2ab. Here, another variable $t_{cs}$ (third simulation time) is defined to indicate a specific time point at which the circuit analyzer 2 solves the given circuit equations. This simulation time $t_{cs}$ advances in a stepwise manner, being incremented by a time step size $\Delta t_{cs}$ (second time step size). Note that the time step size $\Delta t_{cs}$ may vary as the circumstances require. The circuit analyzer 2 monitors the difference between $t_{em}01$ and $t_{cs}$, and if the difference falls below a predetermined time difference threshold $\lambda 1$ (first time difference threshold), it starts waiting for the next current source data to be supplied. When this data is ready, the circuit analyzer 2 updates the equivalent circuit with the supplied current source data to continue the circuit analysis.

When the simulation time $t_{cs}$ is advanced by the time step size $\Delta t_{cs}$, the circuit analyzer 2 further examines whether the resultant $t_{cs}$ has exceeded $t_{em}01$, and whether their difference is not less than the predetermined time difference threshold $\lambda 1$. If both criteria are met, the circuit analyzer 2 turns back $t_{cs}$ by canceling the increment $\Delta t_{cs}$ added above. Then it advances $t_{cs}$ again with a new time step size $\Delta t_{cs}$ that is now given a smaller value.

Similarly, the circuit analyzer 2 examines the value of $t_{cs}$ after advancing it by $\Delta t_{cs}$. If the resultant simulation time $t_{cs}$ has exceeded $t_{em}02$, and if their difference is not less than a predetermined time difference threshold $\lambda 2$ (second time difference threshold), the circuit analyzer 2 turns back $t_{cs}$ by canceling the increment. Then it reduces the time step size $\Delta t_{cs}$, and advances $t_{cs}$ again by the reduced time step size $\Delta t_{cs}$. Here, the predetermined time difference thresholds $\lambda 1$ and $\lambda 2$ have sufficiently small values, which is about one hundredth of $\Delta t_{em}$, for instance.

The current source data transfer unit 3 compares $t_{em}01$ with $t_{cs}$, and if their difference falls below the time difference threshold $\lambda 1$, it starts to calculate current source data for use in the equivalent circuit, based on the magnetic field obtained by the electromagnetic wave analyzer 1. The resultant current source data is then transferred to the circuit analyzer 2.

The electric field data transfer unit 4 compares $t_{em}02$ with $t_{cs}$, and if their difference falls below the time difference threshold $\lambda 2$, it starts to calculate electric field data for the circuit's local space, based on the voltage obtained by the circuit analyzer 2. The resultant electric field data is then transferred to the electromagnetic wave analyzer 1.

Figure 2:
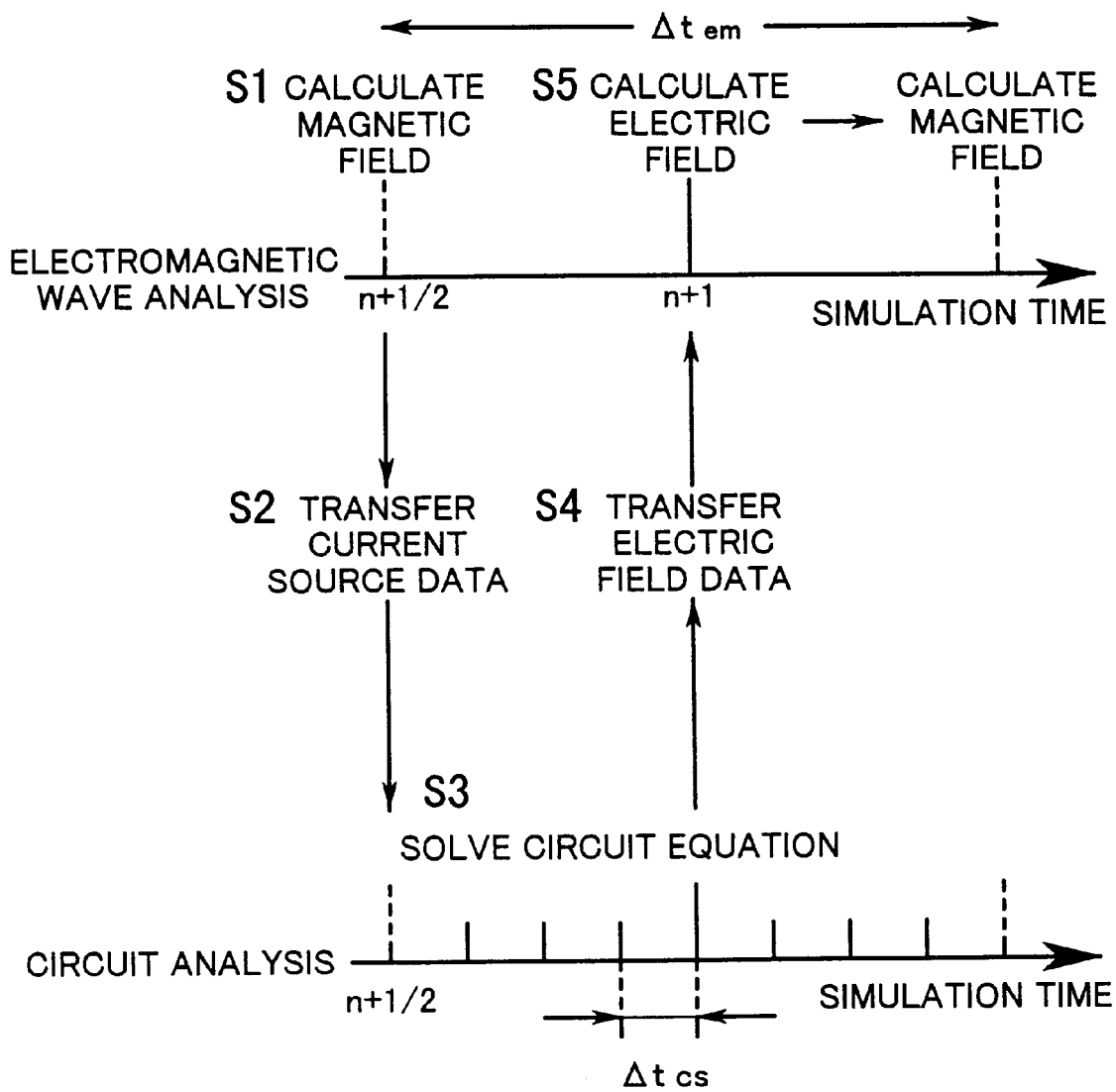
FIG. 2 is a diagram which shows a procedure of data transfer between an electromagnetic wave analysis and a circuit analysis.

Referring now to FIG. 2, the next few paragraphs will describe how the data is transferred between the electromagnetic wave analysis and the circuit analysis. In the equations appearing in the following section (and in FIG. 2), each superscript indicates a specific time step k, or the k-th step within a simulation process, meaning that a simulation time of $(k \times \Delta t_{em})$ has elapsed since the beginning of the process.

(S1) The electromagnetic wave analyzer 1 calculates the magnetic field at a simulation time $t_{em}01=(n+\frac{1}{2})\Delta t_{em}$, where n is a natural number. This calculation is based on the following equation.

$$H^{n+\frac{1}{2}} = H^{n-\frac{1}{2}} - (\Delta t_{em}/\mu) \, \text{rot} \, E_n \qquad (8)$$

(S2) The circuit analyzer 2 simulates the circuit's behavior. When the condition $|t_{cs} - t_{em}01| < \lambda 1$ is met during this circuit analysis, the circuit analyzer 2 stops the present simulation and waits the provision of new current source data. Also, when the condition $|t_{cs} - t_{em}01| < \lambda 1$ is met, the current source data transfer unit 3 calculates the current source data according to the magnetic field obtained by the electromagnetic wave analyzer 1. The resultant current source data is then transferred to the circuit analyzer 2. The current source data I can be obtained by the following.

$$I^{n+\frac{1}{2}} = \Sigma H^{n+\frac{1}{2}} \qquad (9)$$

(S3) With the new current source data supplied, the circuit analyzer 2 resumes the circuit analysis from the simulation time $t_{cs}$ according to the following equation.

$$V^{n+\frac{1}{2}} = Z^{31\,1}I^{n+\frac{1}{2}}, \qquad (10)$$

where Z is the impedance matrix of the circuit model. The circuit analyzer 2 repeats the calculation, incrementing $t_{cs}$ by $\Delta t_{cs}$.

(S4) When the condition $|t_{cs} - t_{em}02| < \lambda 2$ is met, the electric field data transfer unit 4 calculates electric field data for the circuit's local space, based on the voltage obtained through the circuit analysis. The electric field data calculated by the following equation is then transferred to the electromagnetic wave analyzer 1.

$$E^{n+1} = V^{n+\frac{1}{2}}/d \qquad (11)$$

(S5) Upon receipt of the electric field data from the electric field data transfer unit 4, the electromagnetic wave analyzer 1 calculates the electric field at $t_{em}02 = (n+1)\Delta t_{em}$ by $$E^{n+1} = E^n + (\Delta t_{em}/\epsilon) \, \text{rot} \, H^{n+\frac{1}{2}} \qquad (12)$$

The electromagnetic wave analyzer 1 obtains the electric field for the predetermined space by applying the received electric field data to the circuit's local space and calculating the electric field for the remaining space according to Equation (12).

In the simulator described above, the transfer operation of current source data occurs when the circuit analyzer's simulation time $t_{cs}$ has approached the electromagnetic wave analyzer's simulation time $t_{em}01$ for the magnetic field. Similarly, the transfer operation of electric field data occurs when the circuit analyzer's simulation time $t_{cs}$ has approached the electromagnetic wave analyzer's simulation time $t_{em}02$ for the electric field. As a result, every data transfer operation is synchronized with the internal calculation timing of the electromagnetic wave analysis, despite the timing offset between magnetic field calculation and electric field calculation.

Figure 3:
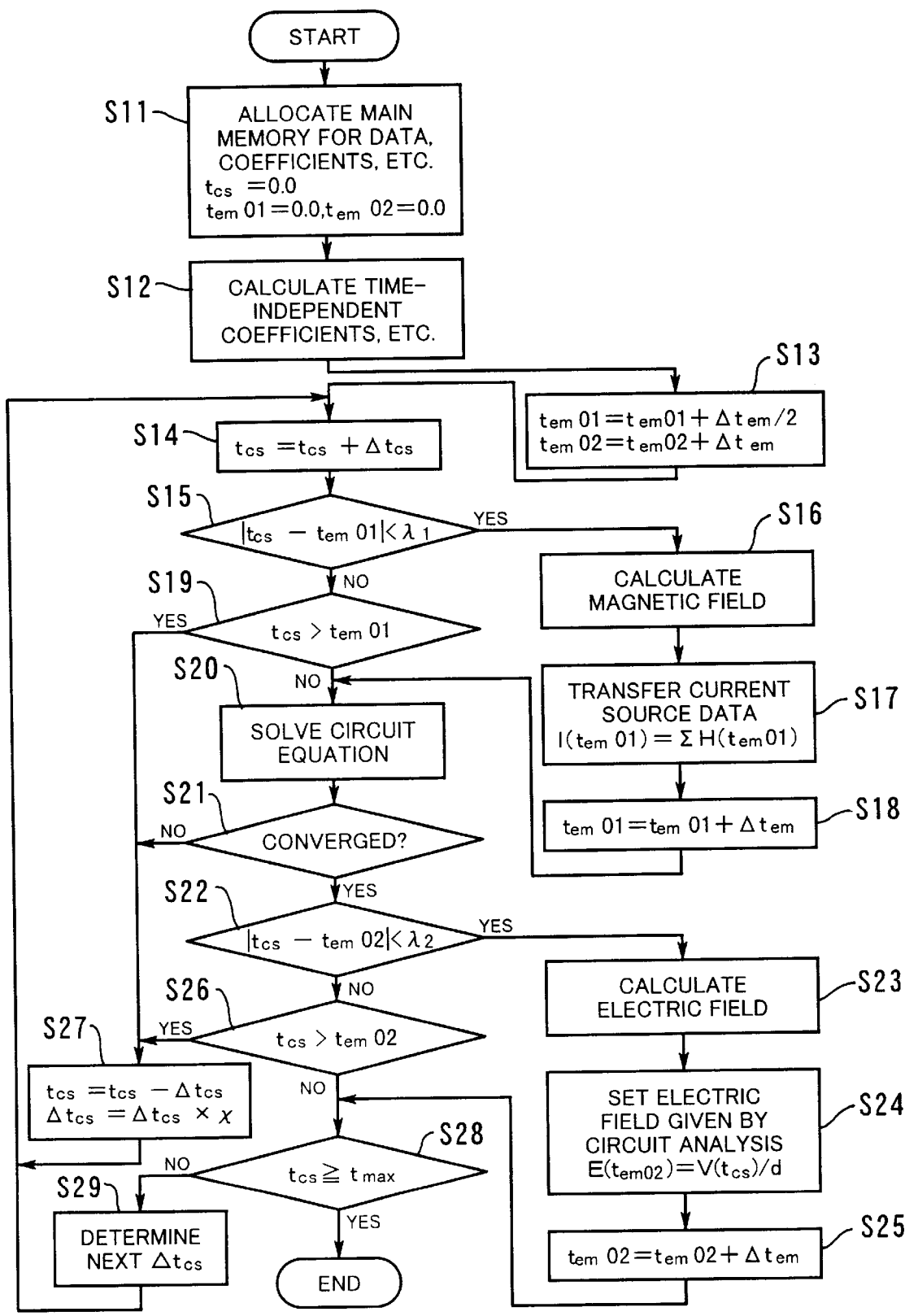
FIG. 3 is a flowchart which shows a procedure of simulation according to the present invention.

Further, the present invention controls the simulation time $t_{cs}$ not to advance too far beyond the simulation time $t_{em}01$ or $t_{em}02$, thus preventing the simulation from failure. The following section will explain the simulation procedure in more detail, including the control of $t_{cs}$. FIG. 3 is a flowchart showing the simulation procedure according to the present invention. Note here that the steps described in FIG. 3 are executed by the elements shown in FIG. 1, with the exception that the first step 11 is the responsibility of a system controller (not illustrated) which totally supervises the simulation process.

(S11) The system controller allocates an appropriate data area within the main memory for storage of coefficients and other data, as well as initializing variables and parameters to be used in the simulation process. The time variables indicative of the circuit analyzer's simulation times ($t_{cs}$) and the electromagnetic wave analyzer's simulation times ($t_{em}01$ and $t_{em}02$) are all initialized to 0.0 in this step S11.

(S12) The circuit analyzer 2 calculates time-independent coefficients and the like.

(S13) The electromagnetic wave analyzer 1 adds $\Delta t_{em}/2$ to $t_{em}01$, and $\Delta t_{em}$ to $t_{em}02$.

(S14) The circuit analyzer 2 increments $t_{cs}$ by $\Delta t_{cs}$.

(S15) The circuit analyzer 2 examines whether the difference between $t_{cs}$ and $t_{em}01$ falls below $\lambda 1$ (i.e., $|t_{cs} - t_{em}01| < \lambda 1$ is true) or not. If this condition is true, the process advances to step S16, and otherwise, the process proceeds to step S19. The above criterion can alternatively be $|t_{cs} - t_{em}01| \leq \lambda 1$.

(S16) The electromagnetic wave analyzer 1 calculates the magnetic field.

(S17) The current source data transfer unit 3 transfers the current source data obtained through the electromagnetic field analysis to the circuit analyzer 2.

(S18) The electromagnetic wave analyzer 1 increments $t_{em}01$ by $\Delta t_{em}$. That is, the simulation time is advanced by the time step size $\Delta t_{em}$ for the electromagnetic wave analysis. The process then proceeds to step S20.

(S19) The circuit analyzer 2 examines whether the condition $t_{cs} > t_{em}01$ is true or false. That is, the circuit analyzer 2 checks that the simulation time $t_{cs}$ of the circuit analysis has not exceeded the simulation time $t_{em}01$ of the electromagnetic wave analysis. If the simulation time $t_{cs}$ is beyond $t_{em}01$, the process branches to step S27. Otherwise, the process advances to step S20.

(S20) The circuit analyzer 2 solves a given circuit equation, thereby obtaining a voltage developed across the circuit at the simulation time $t_{cs}$.

(S21) The circuit analyzer 2 checks whether the solution has successfully converged or not. If converged, the process advances to step S22, and otherwise, the process goes to step S27.

(S22) The circuit analyzer 2 examines whether the difference between $t_{cs}$ and $t_{em}02$ falls below $\lambda 2$ (i.e., the condition $|t_{cs} - t_{em}02| < \lambda 2$ is true) or not. If this condition is met, the process advances to step S23, and otherwise, the process proceeds to step S26. The above criterion can alternatively be $|t_{cs} - t_{em}02| \leq \lambda 2$.

(S23) The electromagnetic wave analyzer 1 calculates the electric field. In this step S23, the electric field in the space excluding the circuit's local space is calculated.

(S24) The electric field data transfer unit 4 supplies the electromagnetic wave analyzer 1 with the electric field data obtained as a result of the circuit analysis. The electromagnetic wave analyzer 1 applies the received electric field data to the circuit's local space.

(S25) The electromagnetic wave analyzer 1 increments $t_{em}02$ by $\Delta t_{em}$. That is, the time step for the electric field calculation is advanced by the time step size $\Delta t_{em}$, which is a predetermined parameter for the electromagnetic wave analysis. The process then advances to step S28.

(S26) The circuit analyzer 2 examines whether the condition $t_{cs} > t_{em}02$ is true or false. That is, the circuit analyzer 2 checks that the time $t_{cs}$ of the circuit analysis has not outstripped the time $t_{em}02$ of the electromagnetic wave analysis. If $t_{cs}$ has outstripped $t_{em}02$, the process proceeds to step S27. Otherwise, the process advances to step S28.

(S27) The circuit analyzer 2 cancels the preceding increment by subtracting $\Delta t_{cs}$ from $t_{cs}$, and it then reduces the time step size by multiplying $\Delta t_{cs}$ by $\chi$, where $\chi$ is a predetermined real number within the range of $0<\chi<1$. The process then returns to step S14.

(S28) The circuit analyzer 2 examines whether $t_{cs}$ has exceeded $t_{max}$ or not. If this condition is met, the process is terminated. Otherwise, the process proceeds to step S29. Here, $t_{max}$ is a predetermined parameter that indicates the maximum simulated time.

(S29) The circuit analyzer 2 determines the next $\Delta t_{cs}$, and returns to step S14.

In this way, the simulator of the present invention accomplishes a combined simulation of electromagnetic wave analysis and circuit analysis. The proposed simulation process never fails, since the circuit analyzer's simulation time $t_{cs}$ is controlled not to exceed that of the electromagnetic wave analyzer, $t_{em}01$ or $t_{em}02$.

The simulator of the present invention transfers current source data and electric field data, considering the presence of a time offset of $\Delta t_{em}/2$ between the magnetic field calculation and electric field calculation in the electromagnetic wave analysis. This contributes to the stability of solution. Furthermore, the proposed simulator allows the electromagnetic wave analyzer to use the condition (2) to determine its time step size $\Delta t_{em}$, and requires no further reduction in its magnitude. Therefore, the computational loads does not increase in the present embodiment, unlike the conventional methods.

In the present embodiment, the circuit analyzer's time step size $\Delta t_{cs}$ is controlled not to exceed $\Delta t_{em}/2$, although it is allowed to be changed according to the circumstances. With this constraint, the simulation time $t_{cs}$ is less likely to go beyond the simulation time $t_{em}01$ or $t_{em}02$, thus reducing the chances of executing extra process steps (i.e., the loop including step S27 in FIG. 3).

The next section will now present an example of a microstrip line simulation performed by the proposed simulator.

Figure 4:
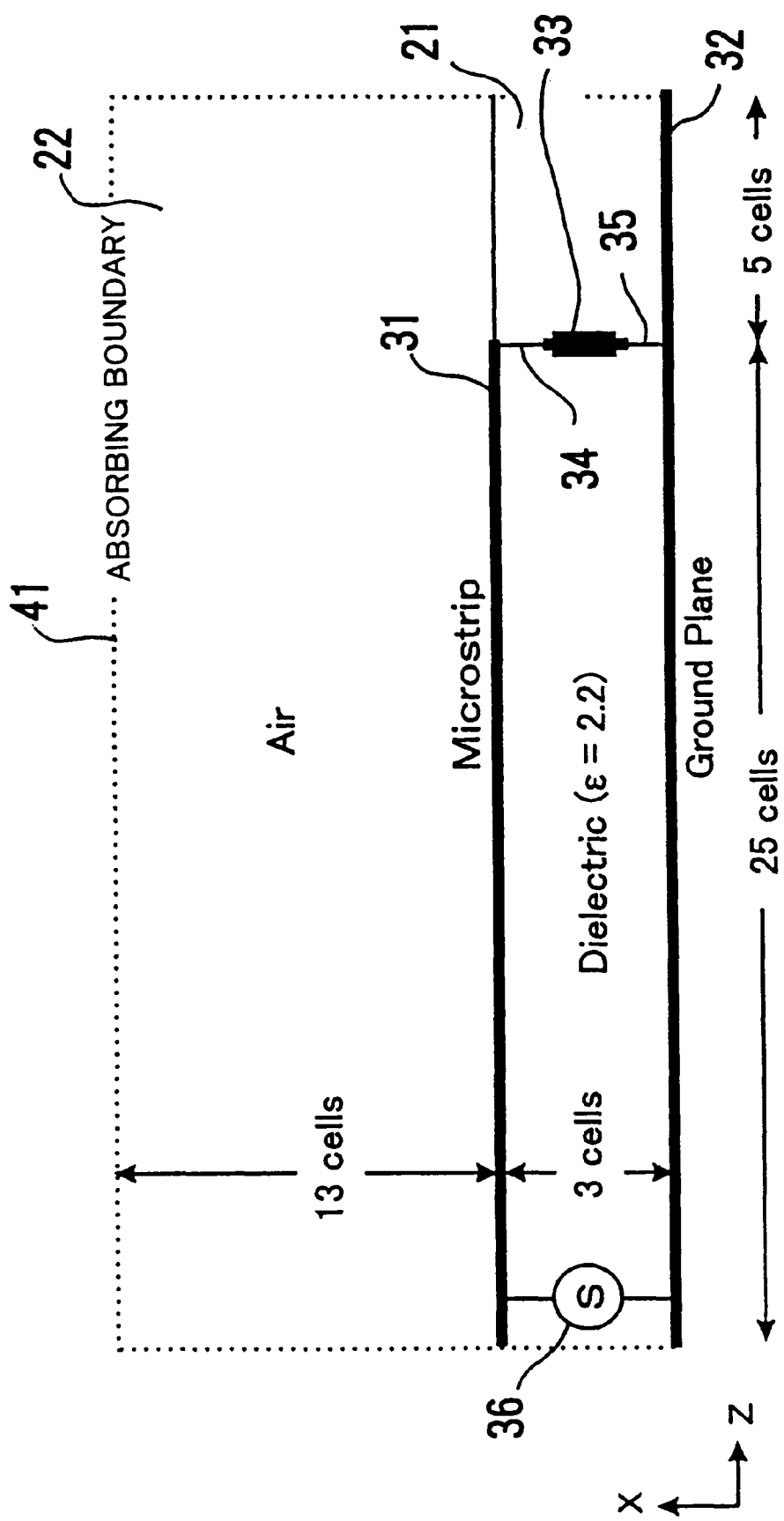
FIG. 4 is a side view of a microstrip transmission line.

FIG. 4 is a side view of a microstrip transmission line. The computational domain, or calculation space, is divided into cells each having a volume of dx×dy×dz=0.265×0.389×0.400 [mm³]. The illustrated microstrip transmission line is formed on a substrate 21 with dielectric constant $\epsilon=2.2$, having a thickness of three cell distances in the X-axis direction. A conducting strip 31 and a ground plane conductor 32 are thin film conductors formed on the top side and the bottom side of the substrate 21, respectively. As FIG. 4 shows, a diode 33 is placed at the right-hand end of the conducting strip 31. The anode of this diode 33 is connected to the conducting strip 31 by a thin wire 34, while its cathode is connected to the ground plane conductor 32 by another thin wire 35. Further, to feed a high-frequency signal, an AC power source 36 is disposed between the left-hand end of the conducting strip 31 and the ground plane conductor 32.

The conducting strip 31 formed on the top surface of the substrate 21 has a length of 25 cell intervals in the Z-axis direction, while the ground plane conductor 32 formed on the bottom surface of the substrate 21 has a length of 30 cell intervals in the Z-axis direction. The space surrounding the substrate 21 is filled with air 22. There is provided an absorbing boundary 41 as indicated by a dotted line in FIG. 4, whose dimensions are 16 cell intervals in the X-axis direction by 30 cell intervals in the Z-axis direction.

Figure 5:
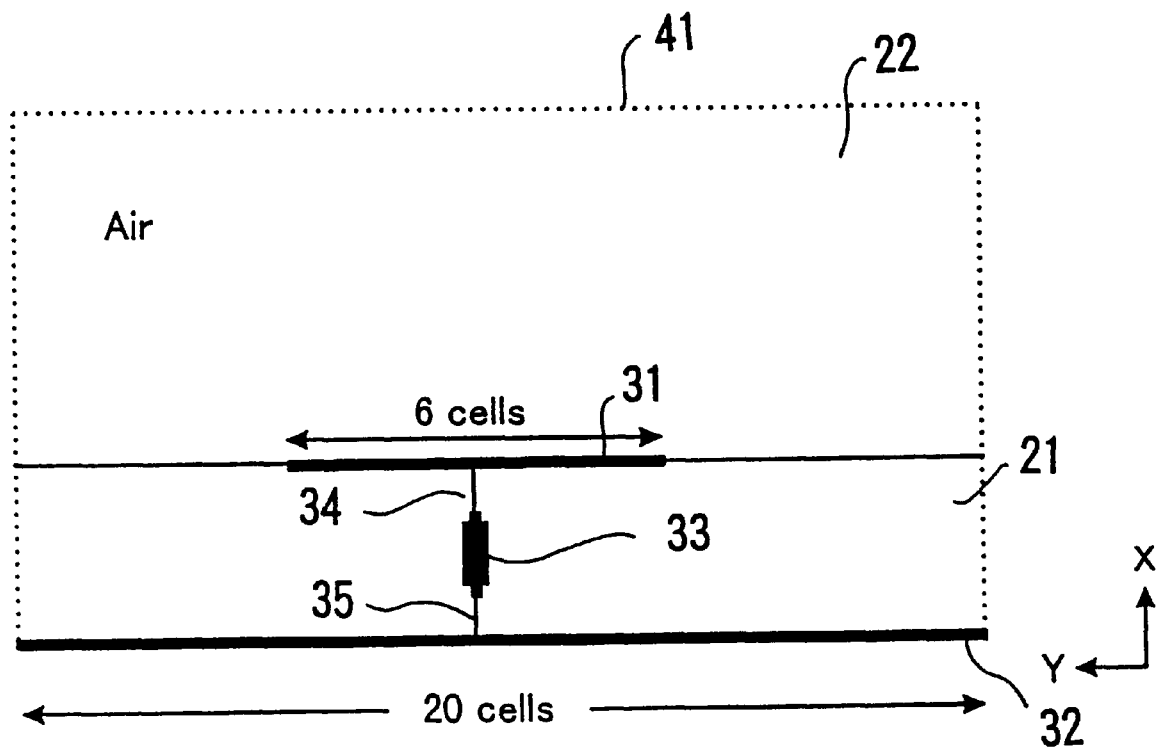
FIG. 5 is a transverse cross section of the microstrip transmission line.

FIG. 5 is a transverse cross section of the same microstrip transmission line. The conducting strip 31 has a width of six cell intervals in the Y-axis direction, and the anode-side wiring from the diode 33 is done on its center line. Likewise, the ground plane conductor 32 has a width of 20 cell intervals in the Y-axis direction, and the cathode-side wiring from the diode 33 is done on its center line. The absorbing boundary 41's width in the Y-axis direction is 20 cell intervals.

For comparison, the above microstrip line is evaluated with two simulators: a conventional simulator and a new simulator proposed in the present invention. The following paragraphs will show the simulation results with reference to FIGS. 6 to 8.

Figure 6:
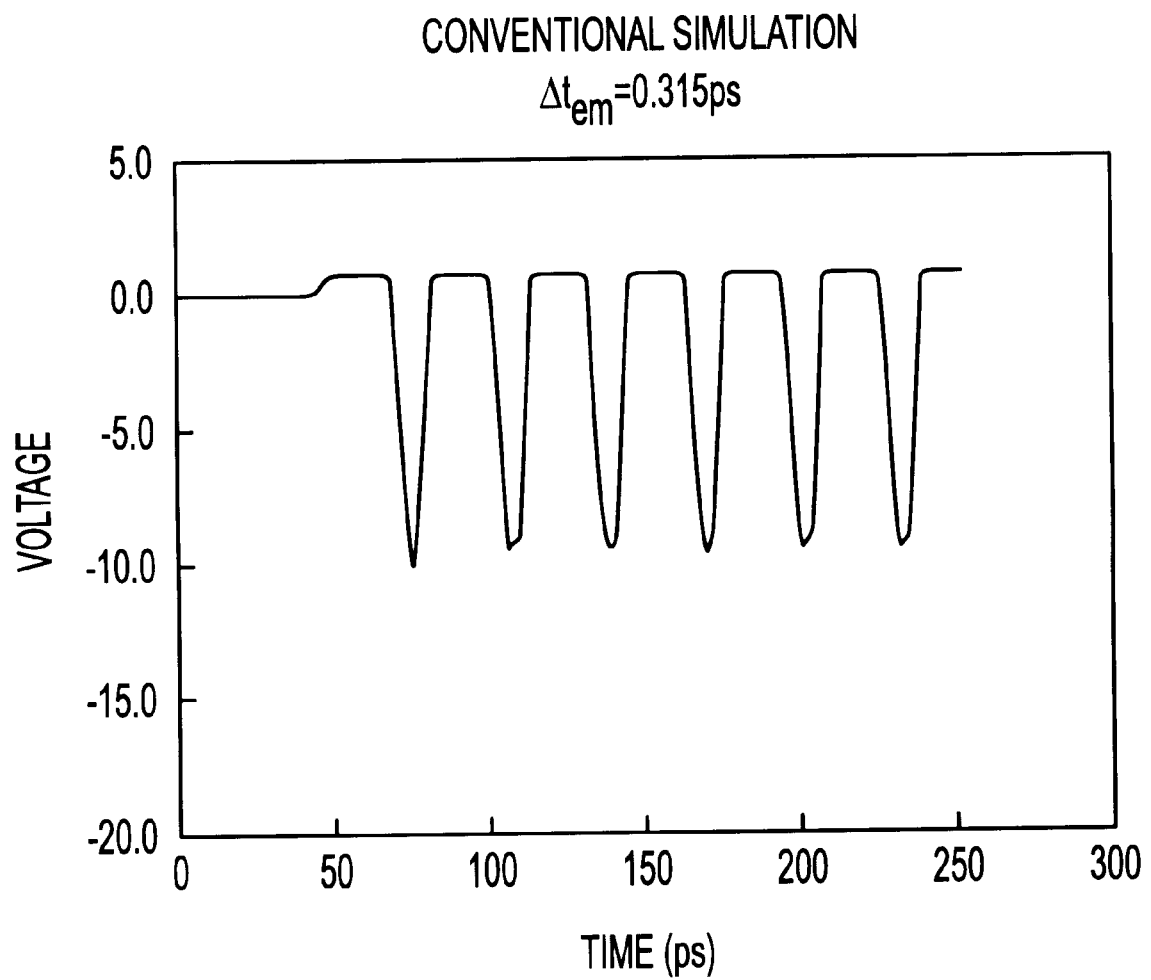
FIG. 6 is a diagram which shows the result of a conventional simulation with a time step size $\Delta t_{em}$ of 0.315 ps.

FIG. 6 is a diagram showing the result of a conventional simulation with a time step size of $\Delta t_{em}=0.315$ ps. The horizontal axis of FIG. 6 represents simulation time in picoseconds (ps), and the vertical axis shows the voltage developed across the diode 33. The same convention applies to other diagrams, FIGS. 7 and 8. Although this small time step size, $\Delta t_{em}=0.315$ ps allows the conventional simulator to provide stable solutions, it is so shorter than usual that a fair amount of processing loads are imposed on the electromagnetic wave analyzer.

Figure 7:
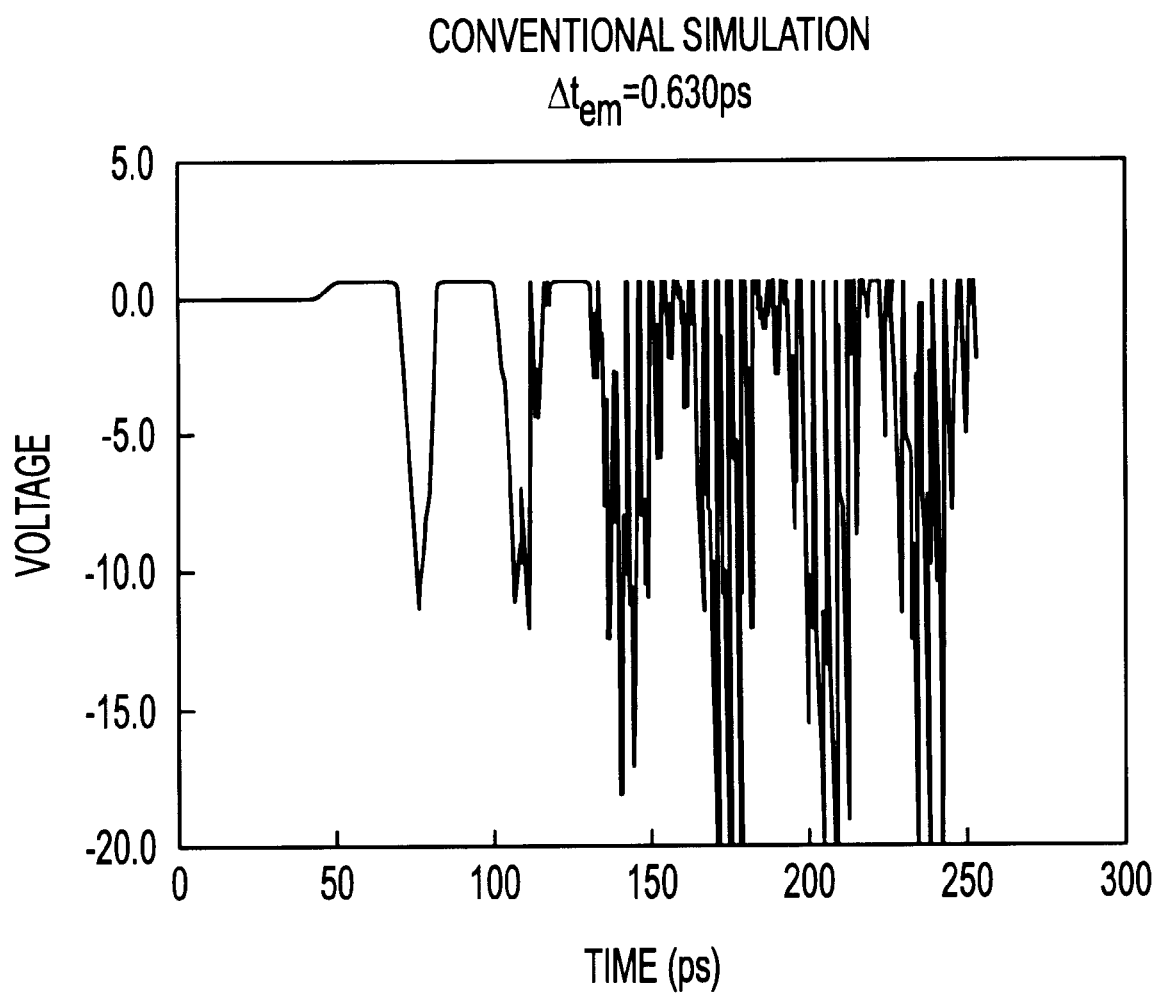
FIG. 7 is a diagram which shows the result of a conventional simulation with a time step size $\Delta t_{em}$ of 0.630 ps.

To reduce the loads, the microstrip line simulation has been conducted again by using the same conventional simulator, but now with a time step size doubled. FIG. 7 shows the result of this simulation with a time step size of $\Delta t_{em}=0.630$ ps. With this doubled time step size, however, the voltage solution exhibits apparent instability, including oscillations that increases with time.

Figure 8:
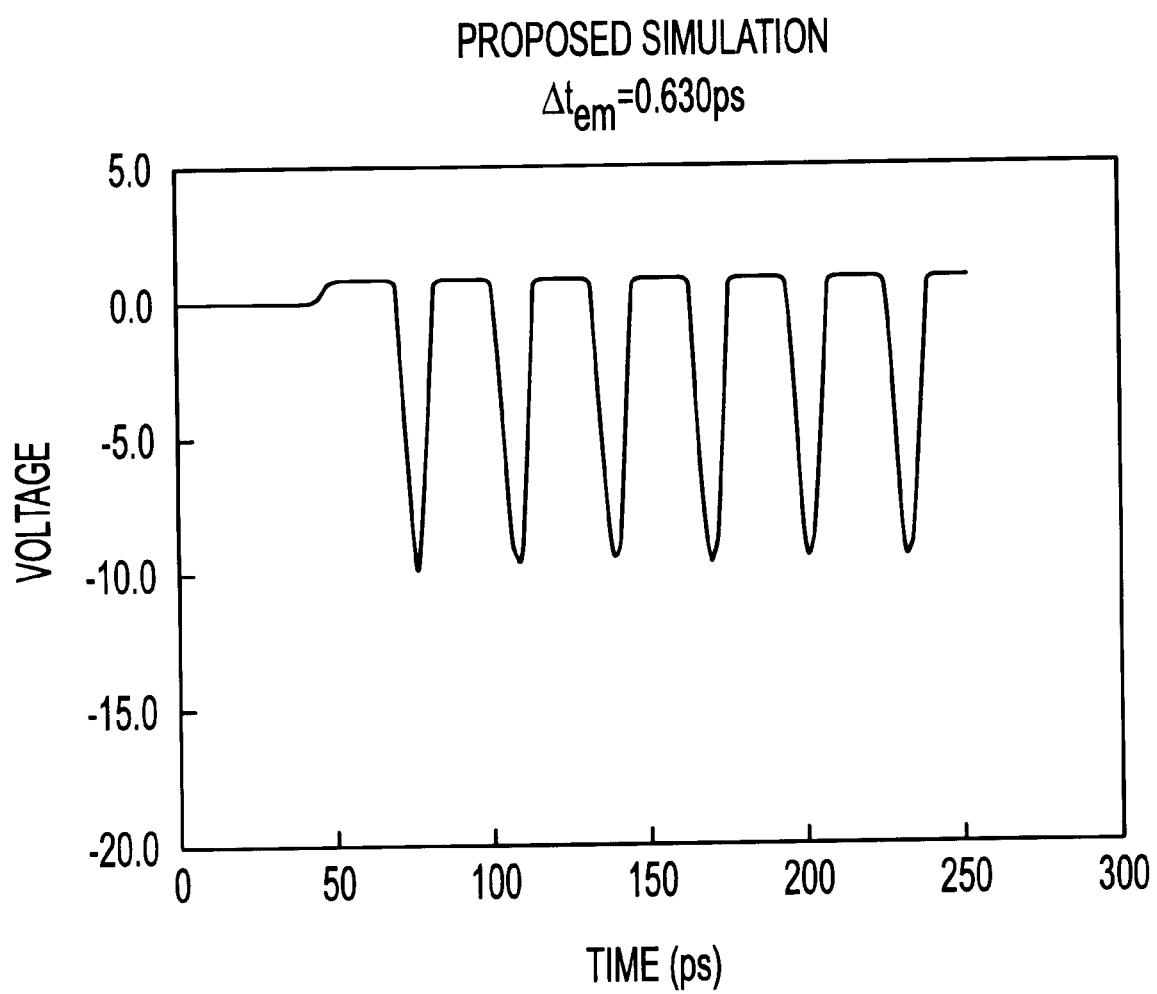
FIG. 8 is a diagram which shows the result of a simulation performed by the propose simulator, with a time step size $\Delta t_{em}$ of 0.630 ps.
Figure 9:
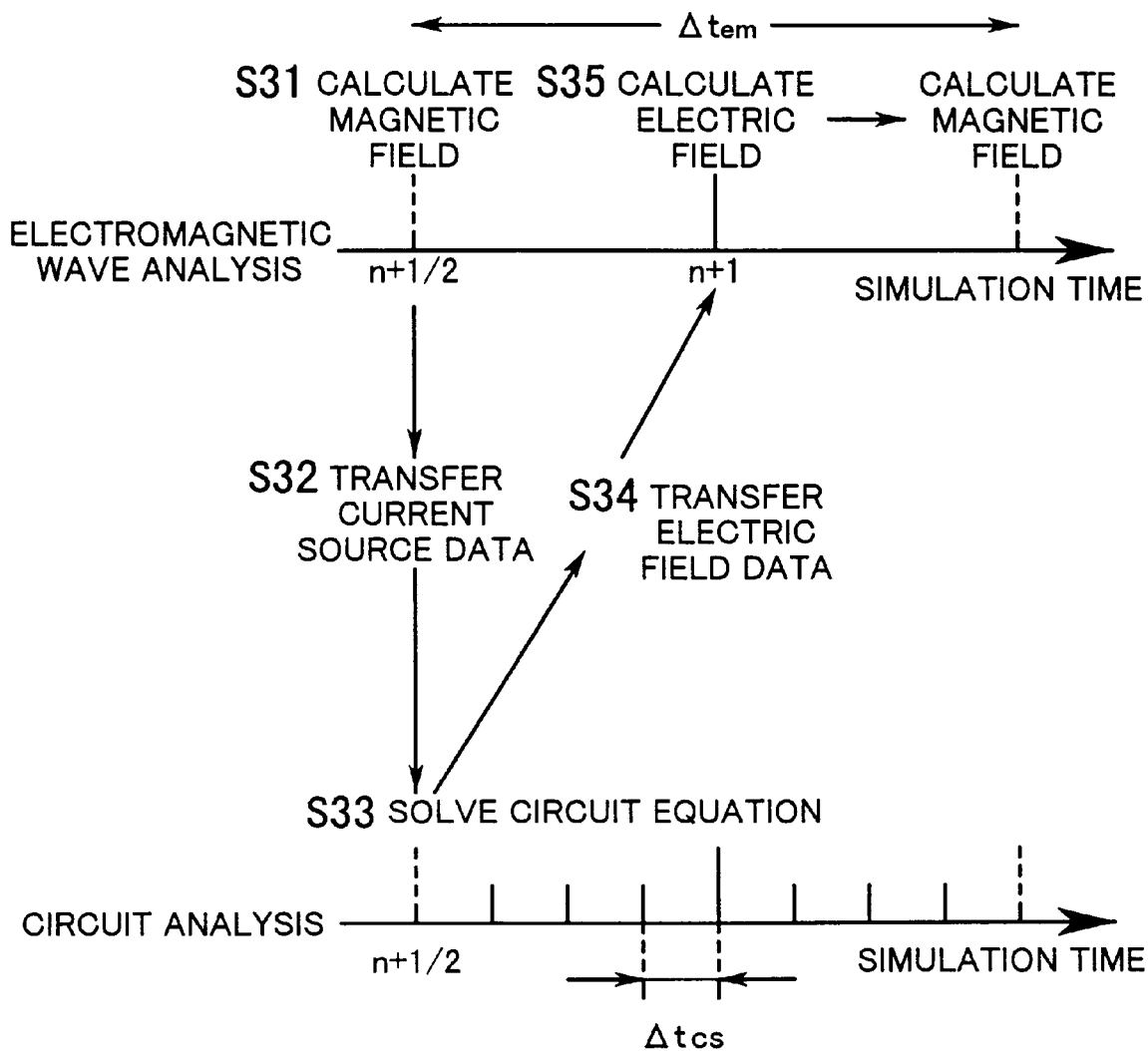
FIG. 9 is a diagram which shows the timing of data transfer operations in a conventional simulator.

Then, for comparison purposes, the same simulation has been done with the same time step size as in FIG. 7, but using the simulator of the present invention. FIG. 8 shows the result of this simulation performed by the proposed simulator, with a time step size of $\Delta t_{em}=0.630$ ps. As FIG. 8 shows, the simulator of the present invention yields stable solutions even if a larger time step size is used, and therefore, it is no longer necessary for the practitioners to set a reduced time step size when conducting an electromagnetic wave analysis in combination with circuit analysis techniques. As such, the present invention enables a stable simulation with a smaller amount of processing loads.

The above-described processing mechanisms will actually be implemented as software functions of a computer system. The functionalities of the proposed simulator are encoded in a computer program, which will be stored in a computer-readable storage medium. A computer executes this program to provide the above simulation processes and functions. The suitable computer-readable storage media include magnetic storage media and solid state memory devices. Some portable storage media, such as CD-ROMs and floppy disks, are also suitable for circulation purposes. Further, it is possible to distribute the program through an appropriate server computer deployed on a network. The program file delivered to a user is normally installed in his/her computer's hard drive or other local mass storage devices, which will be executed after being loaded to the main memory.

The above discussion will now be summarized as follows. According to the present invention, the simulator performs both an electromagnetic wave analysis and a circuit analysis with appropriate linkage mechanisms, in which the electric field data obtained in the circuit analysis is transferred to the electromagnetic wave analysis when the circuit analyzer's time step has approached the timing for the electric field calculation in the electromagnetic wave analysis. This configuration minimizes the time difference between the calculation of electric field data in the circuit analysis and its application to the other electric field, thus improving the stability of solutions.

The concept of the present invention can be paraphrased in more generic form as a simulator apparatus which executes a first simulation process in combination with a second simulation process, where the two simulation processes are allowed to transfer their simulation results to each other only when the difference between the first simulation process's time and the second simulation process's time falls below a predetermined threshold. This configuration permits one simulation process to use the other's simulation result with a minimized time difference, which contributes to the stability of numerical solutions.

Further, the present invention provides a computer-readable medium containing a simulation program which performs both an electromagnetic wave analysis and a circuit analysis with appropriate linkage mechanisms. This simulation program runs on a computer system, allowing a stable simulation for an electromagnetic wave analysis combined with a circuit analysis.

The above concept of the present invention can be paraphrased in more generic form as a computer-readable medium containing a simulation program which performs both a first simulation and a second simulation, where an appropriate linkage mechanism allows the two simulations to exchange their simulation results. The simulation program runs on a computer system, enabling a stable simulation for an electromagnetic wave analysis linked with circuit analysis techniques in the time domain.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A simulator apparatus producing a simulation solution for circuit modeling using a combined solution of circuit analysis and electromagnetic wave analysis to, respectively, solve characteristics of circuit elements and electromagnetic field behavior in a surrounding space of the circuit elements, the simulation solution being based on a combined simulation in which a transient electromagnetic wave analysis for a prescribed space is linked in a time domain with a circuit analysis that analyzes a circuit placed in the prescribed space, comprising:

electromagnetic wave analyzing means for performing an electromagnetic wave analysis by alternately executing a magnetic field calculation and an electric field calculation, the magnetic field calculation being based on a first simulation time that is advanced by a first time step size each time the magnetic field calculation is executed, the electric field calculation being based on a second simulation time that has a predetermined time offset with respect to the first simulation time and is advanced by the first time step size each time the electric field calculation is executed, wherein the electric field calculation includes such an operation that waits for electric field data for a local space where the circuit is located, and upon receipt of the electric field data, computes an entire electric field in the prescribed space by adapting the received electric field data;

circuit analyzing means, operating at a third simulation time that is advanced by a second time step size that is not greater than the first time step size, for calculating a voltage developed across the circuit by solving a given circuit equation at the third simulation time, wherein said calculation of the voltage includes such an operation that waits for current source data for the circuit when a time difference between the first simulation time and the third simulation time falls below a first predetermined time difference threshold that is smaller than the second time step size, and upon receipt of the current source data, resumes the circuit analysis with the received current source data;

current source data transferring means, activated when the time difference between the first simulation time and the third simulation time falls below the first predetermined time difference threshold, for calculating the current source data for the circuit on the basis of the magnetic field obtained by said electromagnetic wave analyzing means, and transferring the calculated current source data to said circuit analyzing means; and electric field data transferring means, activated when the time difference between the second simulation time and the third simulation time falls below a second predetermined time difference threshold that is smaller than the second time step size, for calculating the electric field data in the circuit's local space on the basis of the voltage obtained by said circuit analyzing means, and transferring the calculated electric field data to said electromagnetic wave analyzing means, wherein said simulation solution is output based on said electromagnetic wave analyzing means and said circuit analyzing means.

2. The simulator apparatus according to claim 1, wherein if the third simulation time has exceeded the first simulation time, and the difference between the first simulation time and the third simulation time has exceeded the first predetermined time difference threshold, as a result of advancing the third simulation time by the second time step size, said circuit analyzing means restores the third simulation time and the circuit's state as before the third simulation time is advanced, reduces the second time step size, and advances the third simulation time again by the reduced second time step size, and if the third simulation time has exceeded the second simulation time and the difference between the second simulation time and the third simulation time is greater than the second predetermined time difference threshold, as a result of advancing the third simulation time by the second time step size, said circuit analyzing means restores the third simulation time and the circuit's state as before the third simulation time is advanced, reduces the second time step size, and advances the third simulation time again by the reduced second time step size.

3. The simulation apparatus according to claim 1, wherein said electromagnetic wave analyzing means maintains a time offset of half the first time step size, between the first simulation time and the second simulation time, and said circuit analyzing means controls the second time step size not to exceed half the first time step size.

4. A simulator apparatus producing a simulation solution for circuit modeling using a combined solution of circuit analysis and electromagnetic wave analysis to, respectively, solve characteristics of circuit elements and electromagnetic field behavior in a surrounding space of the circuit elements, the simulation solution being based on a first simulation process in combination with a second simulation process, allowing the first and second simulation processes to transfer simulation results to each other, the first simulation process being based on a first simulation time that is advanced by a fixed time step size, the second simulation process being based on a second simulation time that is advanced by a variable time step size, comprising:

first data transfer means, activated when a time difference between the first simulation time and the second simulation time falls below a predetermined time difference threshold that is smaller than the variable time step size, for transferring a simulation result of the first simulation process to the second simulation process;

analyzing means for executing the second simulation process on the basis of the transferred simulation result of the first simulation process, changing the variable time step size as required; and second data transfer means, activated when a time difference between the second simulation time and the first simulation time, having been advanced by the fixed time step size, falls below another predetermined time difference threshold that is smaller than the variable time step size, for transferring a simulation result of the second simulation process to the first simulation process, wherein said simulation solution is output based on the first simulation process and the second simulation process.

5. A computer-readable medium containing a simulation program producing a simulation solution for circuit modeling using a combined solution of circuit analysis and electromagnetic wave analysis to, respectively, solve characteristics of circuit elements and electromagnetic field behavior in a surrounding space of the circuit elements, the simulation solution being based on a combined simulation in which a transient electromagnetic wave analysis for a prescribed space is linked in a time domain with a circuit analysis that analyzes a circuit located in the prescribed space, the simulation program being designed to run on a computer in order to cause the computer to function as:

electromagnetic wave analyzing means for performing an electromagnetic wave analysis by alternately executing a magnetic field calculation and an electric field calculation, the magnetic field calculation being based on a first simulation time that is advanced by a first time step size each time the magnetic field calculation is executed, the electric field calculation being based on a second simulation time that has a predetermined time offset with respect to the first simulation time and is advanced by the first time step size each time the electric field calculation is executed, wherein the electric field calculation includes such an operation that waits for electric field data for a local space where the circuit is located, and upon receipt of the electric field data, computes an entire electric field in the prescribed space by adapting the received electric field data;

circuit analyzing means, operating at a third simulation time that is advanced by a second time step size that is not greater than the first time step size, for calculating a voltage developed across the circuit by solving a given circuit equation at the third simulation time, wherein said calculation of the voltage includes such an operation that waits for current source data for the circuit when a time difference between the first simulation time and the third simulation time falls below a first predetermined time difference threshold that is smaller than the second time step size, and upon receipt of the current source data, resumes the circuit analysis with the received current source data;

current source data transferring means, activated when the time difference between the first simulation time and the third simulation time falls below the first predetermined time difference threshold, for calculating the current source data for the circuit on the basis of magnetic field obtained by said electromagnetic wave analyzing means, and transferring the calculated current source data to said circuit analyzing means; and electric field data transferring means, activated when the time difference between the second simulation time and the third simulation time falls below a second predetermined time difference threshold that is smaller than the second time step size, for calculating the electric field data in the circuit's local space on the basis of the voltage obtained by said circuit analyzing means, and transferring the calculated electric field data to said electromagnetic wave analyzing means, wherein said simulation solution is output based on said electromagnetic wave analyzing means and said circuit analyzing means.

6. A computer-readable medium containing a simulation program producing a simulation solution for circuit modeling using a combined solution of circuit analysis and electromagnetic wave analysis to, respectively, solve characteristics of circuit elements and electromagnetic field behavior in a surrounding space of the circuit elements the simulation solution being based on a first simulation process in combination with a second simulation process, allowing the first and second simulation processes to transfer simulation results to each other, the first simulation process being based on a first simulation time that is advanced by a fixed time step size, the second simulation process being based on a second simulation time that is advanced by a variable time step size that is not greater than the first time step size, the simulation program being designed to run on a computer in order to cause the computer to function as:

first data transfer means, activated when a time difference between the first simulation time and the second simulation time falls below a predetermined time difference threshold that is not greater than the second time step size, for transferring a simulation result of the first simulation process to the second simulation process;

analyzing means for executing the second simulation process on the basis of the transferred simulation result of the first simulation process, changing the variable time step size as required; and second data transfer means, activated when a time difference between the second simulation time and the first simulation time having been advanced by the fixed time step size falls below another predetermined time difference threshold that is not greater than the second time step size, for transferring a simulation result of the second simulation process to the first simulation process, wherein said simulation solution is output based on the first simulation process and the second simulation process.

* * * * *